United States Patent
Nozaki et al.

(10) Patent No.: US 9,570,507 B2
(45) Date of Patent: Feb. 14, 2017

(54) ENTRENCHED TRANSFER GATE

(71) Applicant: OmniVision Technologies, Inc., Santa Clara, CA (US)

(72) Inventors: Hidetoshi Nozaki, Sunnyvale, CA (US); Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 252 days.

(21) Appl. No.: 13/897,189

(22) Filed: May 17, 2013

(65) Prior Publication Data

US 2013/0248937 A1 Sep. 26, 2013

Related U.S. Application Data

(63) Continuation of application No. 12/860,496, filed on Aug. 20, 2010, now Pat. No. 8,487,350.

(51) Int. Cl.
*H01L 27/148* (2006.01)
*H01L 27/146* (2006.01)
*H01L 29/10* (2006.01)
*H01L 29/66* (2006.01)

(52) U.S. Cl.
CPC ......... *H01L 27/148* (2013.01); *H01L 27/1461* (2013.01); *H01L 27/14603* (2013.01); *H01L 27/14612* (2013.01); *H01L 27/14614* (2013.01); *H01L 27/14616* (2013.01); *H01L 27/14601* (2013.01); *H01L 29/1079* (2013.01); *H01L 29/1083* (2013.01); *H01L 29/66537* (2013.01); *H01L 2924/12043* (2013.01)

(58) Field of Classification Search
CPC .......... H01L 27/14638; H01L 27/1461; H01L 27/148; H01L 27/14806
See application file for complete search history.

(56) References Cited

U.S. PATENT DOCUMENTS 5,644,121 A 7/1997 Nakano et al.
7,364,960 B2 4/2008 Lyu
(Continued)

OTHER PUBLICATIONS

ROC (Taiwan) Patent Application No. 100114949; Office Action with English translation, Dec. 3, 2014, 15 pages.
U.S. Office Action mailed Sep. 25, 2012, U.S. Appl. No. 12/860,496, filed Aug. 20, 2010, (25 pages).
U.S. Office Action mailed Mar. 21, 2013, U.S. Appl. No. 12/860,496, filed Aug. 20, 2010, (23 pages).
(Continued)

*Primary Examiner* — Phat X Cao
*Assistant Examiner* — Diana C Vieira
(74) *Attorney, Agent, or Firm* — Blakely Sokoloff Taylor & Zafman LLP

(57) ABSTRACT

An image sensor pixel includes a semiconductor layer, a photosensitive region to accumulate photo-generated charge, a floating node, a trench, and an entrenched transfer gate. The photosensitive region and the trench are disposed within the semiconductor layer. The trench extends into the semiconductor layer between the photosensitive region and the floating node and the entrenched transfer gate is disposed within the trench to control transfer of the photo-generated charge from the photosensitive region to the floating node.

18 Claims, 8 Drawing Sheets

(56) References Cited

U.S. PATENT DOCUMENTS

| | | | |
|---|---|---|---|
| 8,487,350 B2 | 7/2013 | Nozaki et al. | |
| 8,598,638 B2 * | 12/2013 | Kenichi | H01L 27/14609 257/290 |
| 8,648,362 B2 * | 2/2014 | Nakamura | H01L 27/14607 257/89 |
| 8,658,956 B2 * | 2/2014 | Venezia et al. | 250/208.1 |
| 8,716,769 B2 * | 5/2014 | Ihara | H01L 27/1461 257/291 |
| 2006/0244020 A1 | 11/2006 | Lee | |
| 2007/0075337 A1 | 4/2007 | Jung et al. | |
| 2007/0184614 A1 | 8/2007 | Adkisson et al. | |
| 2008/0277693 A1 | 11/2008 | Mauritzson et al. | |
| 2009/0075416 A1 | 3/2009 | Ohkawa | |
| 2009/0179232 A1 | 7/2009 | Adkisson et al. | |
| 2009/0200580 A1 | 8/2009 | Rhodes et al. | |
| 2009/0200584 A1 * | 8/2009 | Tweet | H01L 27/14641 257/292 |
| 2009/0200585 A1 | 8/2009 | Nozaki et al. | |
| 2010/0133596 A1 * | 6/2010 | Terakawa | 257/292 |
| 2013/0015513 A1 * | 1/2013 | Kido | H01L 27/1461 257/292 |

OTHER PUBLICATIONS

CN 201110245139.9; Third Chinese Office Action, issued on Aug. 28, 2014, (8 pages).

U.S. Notice of Allowance mailed May 28, 2013, U.S. Appl. No. 12/860,496, filed Aug. 20, 2010, (16 pages).

CN 201110245139.9; First Chinese Office Action with Search Report, issued on Oct. 18, 2013, (17 pages).

ROC (Taiwan) Patent Application No. 100114949; Office Action with English translated Search Report, dated Dec. 1, 2014, (10 pages).

CN 201110245139.9; Second Chinese Office Action with Search Report, issued on Mar. 27, 2014, (13 pages).

CN 201110245139.9; Notice of Grant, issued on Feb. 27, 2015, (4 pages).

* cited by examiner

ENTRENCHED TRANSFER GATE

CROSS-REFERENCE TO RELATED APPLICATION

The present application is a Continuation of U.S. patent application Ser. No. 12/860,496, filed on Aug. 20, 2010, now U.S. Pat. No. 8,487,350.

TECHNICAL FIELD

This disclosure relates generally to image sensors, and in particular but not exclusively, to complementary metal-oxide semiconductor ("CMOS") image sensors.

BACKGROUND INFORMATION

Image sensors have become ubiquitous. They are widely used in digital still cameras, cellular phones, security cameras, medical, automobile, and other applications. The technology used to manufacture image sensors, and in particular CMOS image sensors ("CIS"), has continued to advance at great pace. For example, the demands of higher resolution and lower power consumption have encouraged the further miniaturization and integration of the image sensor. Thus, the number of pixels in the pixel array of the image sensor has increased, while the size of each pixel cell has decreased.

Typically each pixel of an image sensor includes a photosensitive element such as a photodiode, and one or more transistors for reading out the signal from the photosensitive element. As pixel cell size decreases, transistors sizes decrease as well. A transfer transistor is commonly used in a pixel with a four-transistor design. The transfer transistor separates the photosensitive element from the rest of the pixel circuitry with the transfer transistor formed between the photosensitive element and a floating node.

In some applications, it is desirable to scale the transfer transistor to have a short gate length in order to achieve greater integration and enhanced pixel fill factor. A short transfer gate length may increase the likelihood of punch-through between the photosensitive element and the floating node. Punch-through occurs when the channel beneath the transfer transistor is depleted and the depletion region surrounding the drain extends through the channel to the source forming a single contiguous depletion region—a detrimental occurrence. On the other hand, a longer transfer gate length may reduce the occurrence of punch-through in conventional pixels, which use an N+ polysilicon transfer gate formed on a flat oxide/silicon substrate. However, a longer transfer gate length may cause problems such as image lag, low sensitivity, and low full well capacity.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and system for a CMOS image sensor ("CIS") are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Directional terminology such as "top", "bottom", "under" is used with reference to the orientation of the figure(s) being described.

Figure 1A:
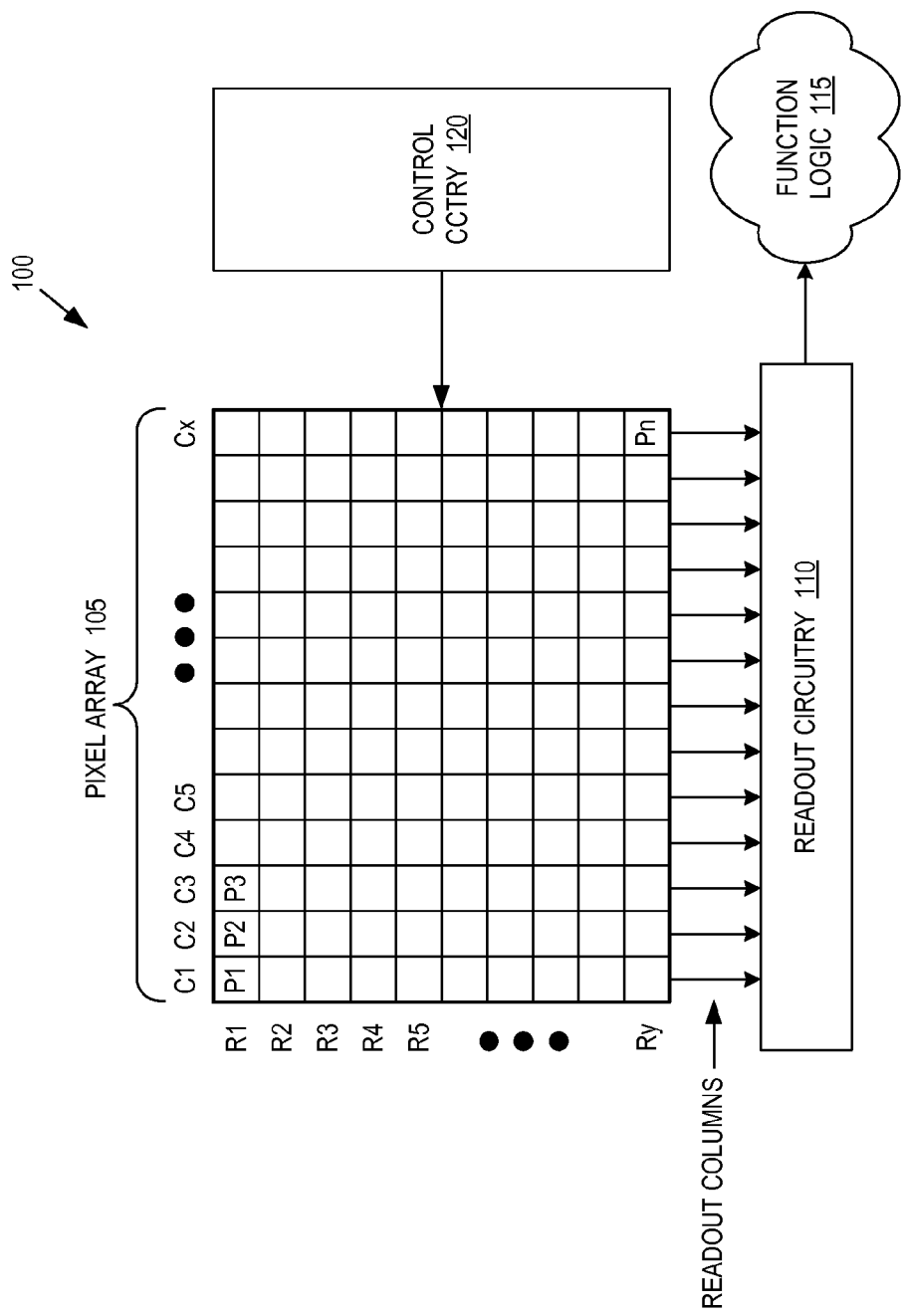
FIG. 1A is a functional block diagram illustrating an imaging system, in accordance with an embodiment.

FIG. 1A is a block diagram illustrating an imaging system 100, in accordance with an embodiment of the invention. The illustrated embodiment of imaging system 100 includes a pixel array 105, readout circuitry 110, function logic 115, and control circuitry 120.

Pixel array 105 is a two-dimensional ("2D") array of imaging sensors or pixels (e.g., pixels P1, P2 . . . , Pn). In one embodiment, each pixel is a complementary metal-oxide-semiconductor ("CMOS") imaging pixel. The pixels may be implemented as backside illuminated pixels or frontside illuminated pixels. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 110 and transferred to function logic 115. Readout circuitry 110 may include amplification circuitry, analog-to-digital ("ADC") conversion circuitry, or otherwise. Function logic 115 may simply store the image data or even manipulate the image data by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristic of pixel array 105. For example, control circuitry 120 may generate a shutter signal for controlling image acquisition. In one embodiment, the shutter signal is a global shutter signal for simultaneously enabling all pixels within pixel array 105 to simultaneously capture their respective image data during a single acquisition window. In an alternative embodiment, the shutter signal is a rolling shutter signal whereby each row, column, or group of pixels is sequentially enabled during consecutive acquisition windows.

Figure 1B:
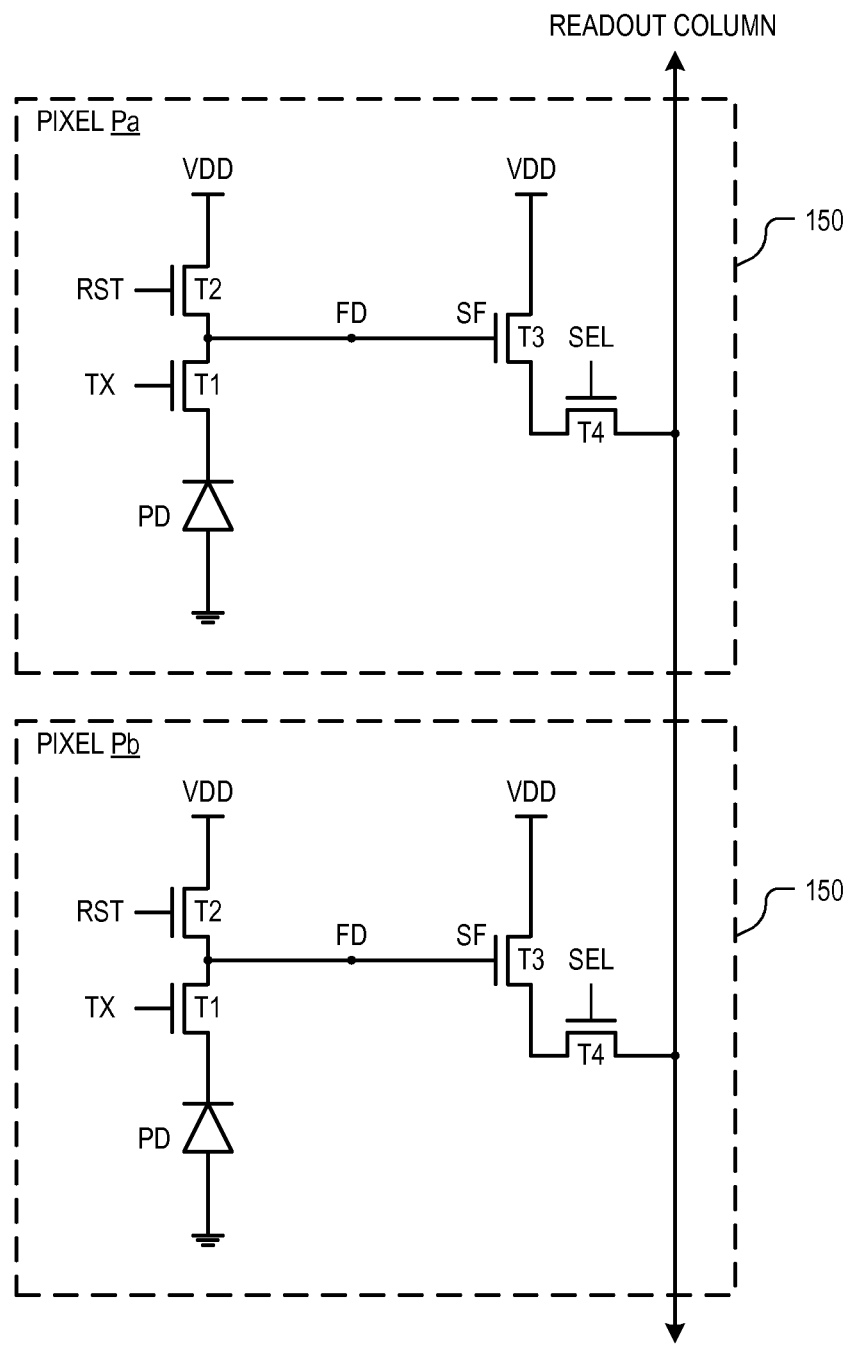
FIG. 1B is a circuit diagram illustrating pixel circuitry of two 4T pixels within an imaging system, in accordance with an embodiment.

FIG. 1B is a circuit diagram illustrating pixel circuitry 150 of two four-transistor ("4T") pixels within a pixel array, in accordance with an embodiment of the invention. Pixel circuitry 150 is one possible pixel circuitry architecture for implementing each pixel within pixel array 105 of FIG. 1A. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures. In FIG. 1B, pixels Pa and Pb are arranged in two rows and one column. The illustrated embodiment of each pixel circuitry 150 includes a photodiode PD, a transfer transistor T1, a reset transistor T2, a source-follower ("SF") transistor T3 and a select transistor T4. During integration, photodiode PD is exposed to electromagnetic energy and converts the collected electromagnetic energy into electrons. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges. Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 150 to the readout column line under control of a select signal SEL.

Figure 2:
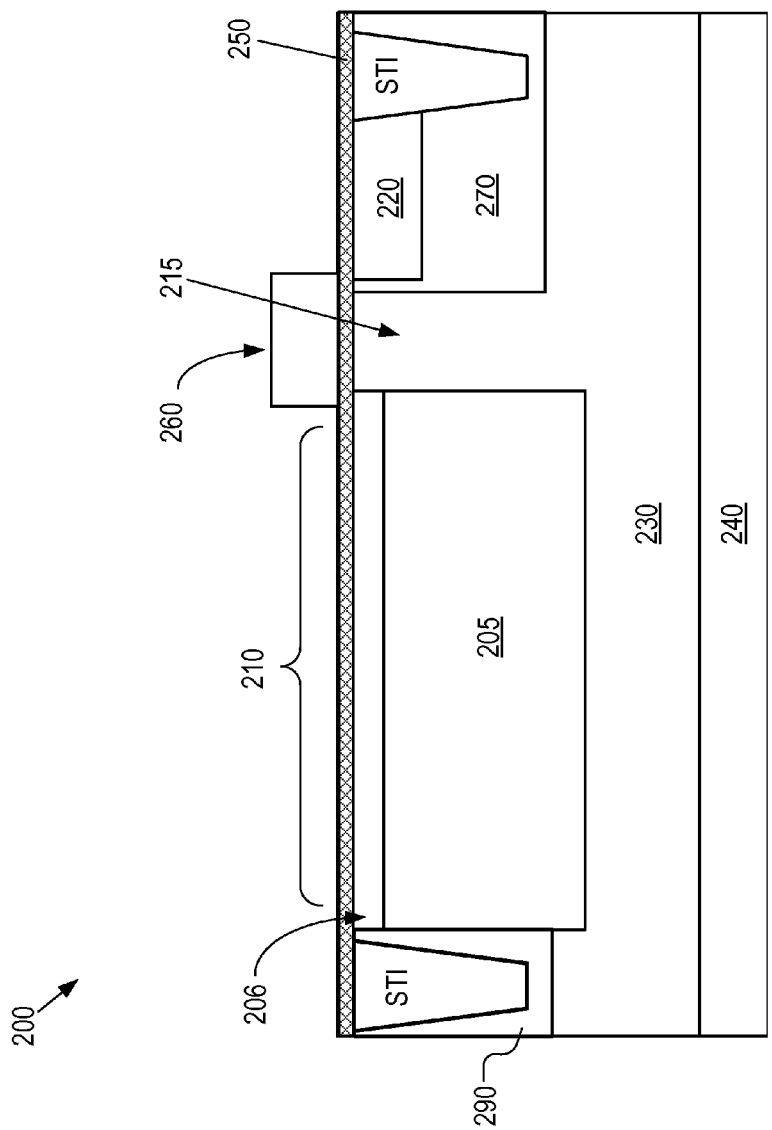
FIG. 2 (PRIOR ART) is a cross-sectional view of a conventional pixel cell of an image sensor illustrating a photosensitive region and a floating node.

FIG. 2 is a cross-sectional view of conventional pixel 200. For simplicity, only certain elements of pixel cell 200 are shown in FIG. 2, such as a photosensitive element 210, a transfer gate 260, and a floating node 220. Photosensitive element 210 includes an n-type photosensor 205 and a p-type pinning region 206. Photosensitive element 210 is formed in epitaxial ("epi") layer 230, which is disposed over substrate 240. Shallow trench isolation ("STI") regions electrically isolate adjacent pixel cells and are formed within p-wells 270 and 290. Channel region 215 is the area of epi layer 230 that separates photosensitive element 210 from floating node 220. Gate oxide 250 is formed on the frontside of epi layer 230, and covers pinning region 206, channel region 215, and floating node 220. Transfer gate 260 is formed on gate oxide 250 in the region over channel region 215 and is formed in the region between photosensitive element 210 and floating node 220.

In pixel 200, transfer gate 260 is highly n-doped and is formed on flat gate oxide 250/epi layer 230, which MOS characteristics can require a relatively long transfer gate length (and therefore a longer channel region 215) so that the possibility of punch through between photosensitive element 210 and floating node 220 may be reduced. However, a relatively long transfer gate length may increase the occurrence of image lag, pixel blooming, low sensitivity, and low full well capacity. In addition to causing these problems, a relatively long transfer gate tends to increase the width of pixel cells, thereby making it difficult to miniaturize the image sensor.

Figure 3A:
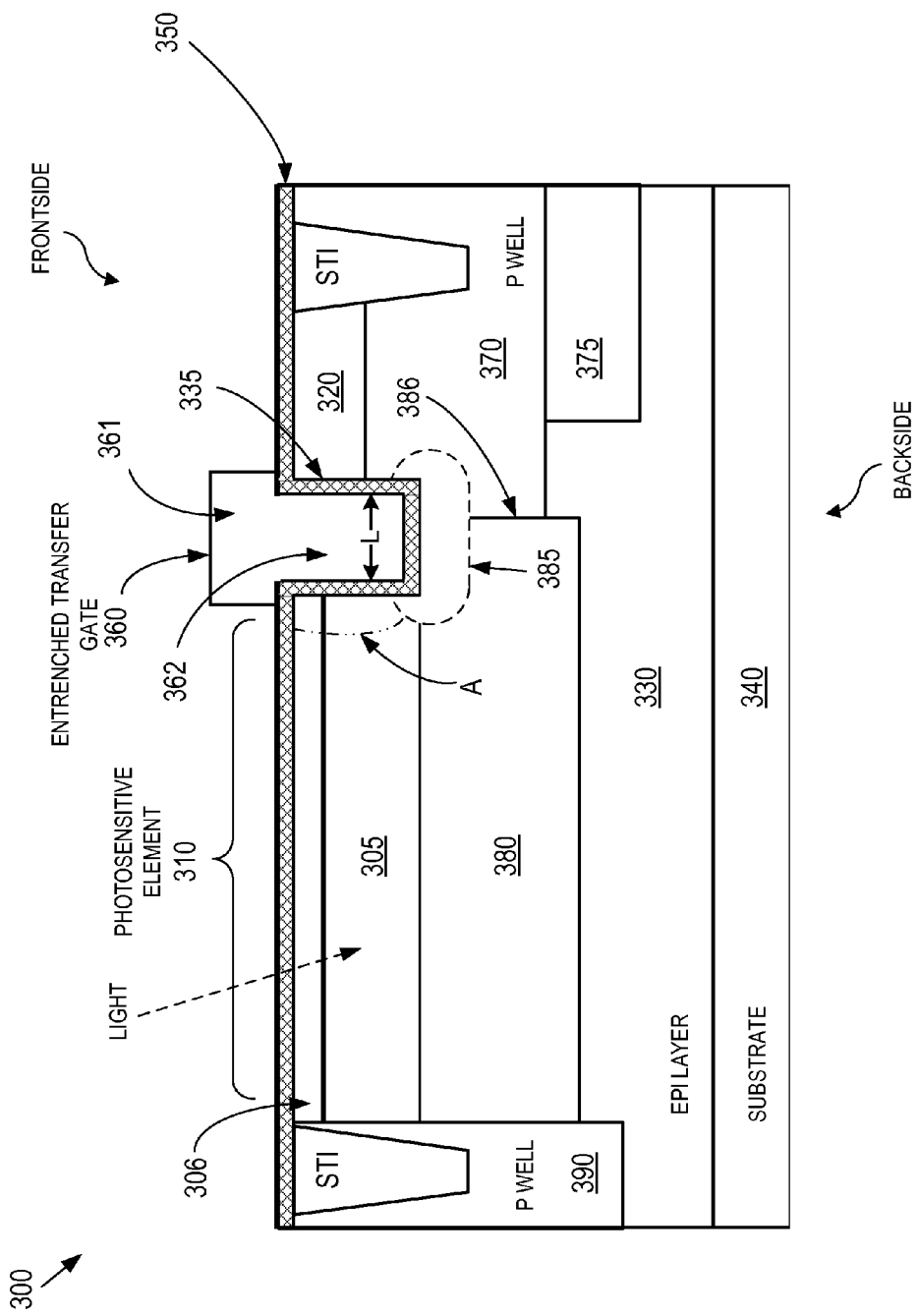
FIG. 3A is a cross-sectional view of a pixel cell including an entrenched transfer gate with a self-aligned punch-through stopper, in accordance with an embodiment.

FIG. 3A is a cross-sectional view of a frontside illuminated ("FSI") pixel cell 300 including an entrenched transfer gate and a p-type self-aligned punch through stopper, in accordance with an embodiment. For simplicity, only selected elements of pixel cell 300 are shown in FIG. 3A, such as a photosensitive element 310, an entrenched transfer gate 360, and a floating node 320, while features like the frontside metal stack, color filter array, and microlenses have been excluded. The illustrated embodiment of photosensitive element 310 includes n-type photosensitive region 305 and a p-type pinning region 306. Photosensitive element 310 is formed in an epitaxial ("epi") layer 330, which is disposed over substrate 340 (both generically referred to as semiconductor layers). STI regions electrically isolate adjacent pixel cells and are formed within p-wells 370 and 390.

In the illustrated embodiment, a trench 335 is formed into the frontside of epi layer 330 between the n-type photosensitive region 305 and the floating node 320. A gate oxide layer 350 lines the top surface of epi layer 330 and covers the upper surface of STI, p-type pinning region 306, floating node 320, p-wells 370 and 390, and an inner surface of trench 335. In the illustrated embodiment, entrenched transfer gate 360 substantially fills the void created by trench 335 and is formed on top of the part of gate oxide layer 350 that lines the inner surface of trench 335. The portion of gate oxide layer 350 that lines the inner surface of trench 335 separates entrenched transfer gate 360 from n-type photosensitive element 310, deep n-type region 380, p-well 370, and floating node 320. Entrenched transfer gate 360 may include two parts: a bottom portion 362 that substantially fills in gate oxide lined trench 335 extending below the top surface of epi layer 330 and a top portion 361 that is on top of bottom portion 362 and extends above oxide layer 350.

A punch through stopper ("PTS") 385 is formed in a region in epi layer 330 that is situated below bottom portion 362 of entrenched transfer gate 360. PTS 385 inhibits depletion of the channel region, thereby inhibiting punch-through of short channels. In one embodiment, PTS 385 is a P-type self-aligned doped region. The self-alignment is a by-product of doping the region of PTS 385 through the bottom surface of trench 335. Deep n-type region 380 is formed in epi layer 330 in a region adjacent to p-well 390 and below n-type photosensitive region 305. Deep n-type region 380 may extend to a region under PTS 385 towards floating node 320. Floating node 320 and an STI are formed within p-well 370. P-well 370 extends to a region adjacent to deep n-type region 380, thereby forming a p-n boundary 386. Deep p-well 375 may be formed under p-well 370.

P-N boundary 386 between deep n-type region 380 and p-well 370 may be situated under PTS 385. Deep n-type region 380 may act to extend the photosensitive region 305, thereby increasing the full well capacity of the photosensitive element 310. Deep p-well 375 and p-well 390 may act to reduce the occurrence of blooming between pixels. In one embodiment, the concentration of ions in n-type photosensitive region 305 is greater than the ion concentration in deep n-type region 380. The ion concentration of p-well 370 and 390 may be similar to that of deep p-well 375. The ion concentration of PTS region 385 may be in the range of $10^{16}$ to $10^{18}/\text{cm}^3$, and in one embodiment, in the range of $5\times10^{16}$ to $5\times10^{17}/\text{cm}^3$. It should be appreciated that the conductivity types of the elements of pixel cell 300 can be flipped. For example, in an alternative embodiment, regions 305, 320, 380 may be doped P-type, while regions 306, 370, 375, 385, and 390 may be doped N-type.

Entrenched transfer gate 360 may be p+- or n+-type, with an ion concentration between $10^{19}$ to $10^{22}/\text{cm}^3$. An entrenched p+ transfer gate may have a higher work function than an entrenched n+ transfer gate. A transfer transistor with an entrenched p+-type transfer gate may be turned on with zero volts (or ground) applied to the gate. If this is done during the integration period, charge may be transferred from photosensitive region 305 to floating node 320. This may reduce the occurrence of dark current in the image sensor.

An entrenched n+-type transfer gate has several characteristics including the following. First, an entrenched n+-type transfer gate may be turned on with a negative voltage applied to the gate. If this is done during the integration period, charge may be transferred from photosensitive region 305 to floating node 320. This may also reduce the occurrence of dark current in the image sensor. Second, although both the entrenched p+-type transfer gate and the entrenched n+-type transfer gate may use a p-type self-aligned PTS, compared with the entrenched p+-type transfer gate, the p-type self-aligned PTS in a sensor pixel with an entrenched n+-type transfer gate may have a higher p-type ion concentration. Third, an n+-type transfer gate may require additional fabrication steps and photomasks because an additional p-type region may be required in region A from FIG. 3A.

To obtain the added benefit of a greater full well capacity, deep n-type region 380 may be extended towards floating node 320 to at least half of gate length L, as shown in FIG. 3A. This would move p-n boundary 386 closer towards the floating node side of trench 335. Generally speaking, p-n boundary 386 should be kept in the region that is directly under p-type PTS 385. However, if deep n-type region 380 or p-well 370 is resized so that p-n boundary 386 is situated in a region that is below either n-type photosensitive region 305 or floating node 320, then additional fabrication steps and photomasks may be required.

Figure 3B:
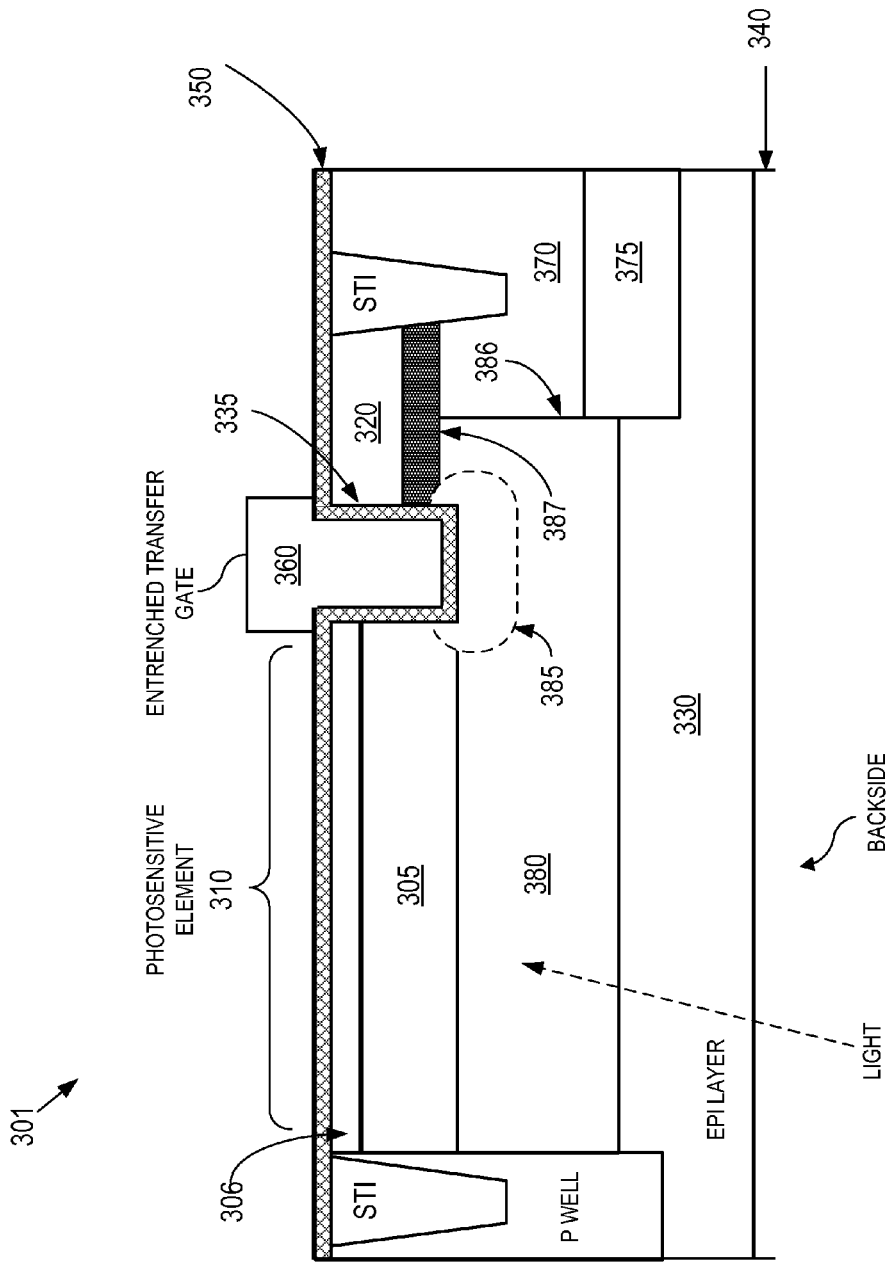
FIG. 3B is a cross-sectional view of a backside illuminated ("BSI") pixel cell including an entrenched transfer gate, in accordance with an embodiment.

For some backside illuminated ("BSI") image sensors, positioning p-n boundary 386 below floating node 320 may produce the benefit of a greater full well capacity. In such a scenario, additional fabrication steps and photomasks may be justified. FIG. 3B illustrates a BSI pixel cell 301 including entrenched transfer gate 360 and PTS 385, in accordance with an embodiment. Contrasting with FIG. 3A, the embodiment in FIG. 3B includes several noticeable features. First, p-n boundary 386 is situated in the region below floating node 320. Second, a p-type region 387 is implanted in the region below floating node 320 and between trench 335 and the STI within p-well 370. This p-type region 387 may have an ion concentration that is higher than that of the p-well 370 and the deep p-well 375. In another embodiment (not shown), the p-n boundary 386 may be situated in a region below the n-type photosensitive region 305. Third, substrate 340 has been backside thinned, relative to FSI pixel cell 300. In one embodiment, substrate 340 may be completely removed and the backside of epi layer 330 doped for passivation. Although not illustrated, additional layers may be disposed over the backside including a color filter array and microlenses (these elements maybe disposed over the frontside in the FSI pixel cell 300).

Figure 4:
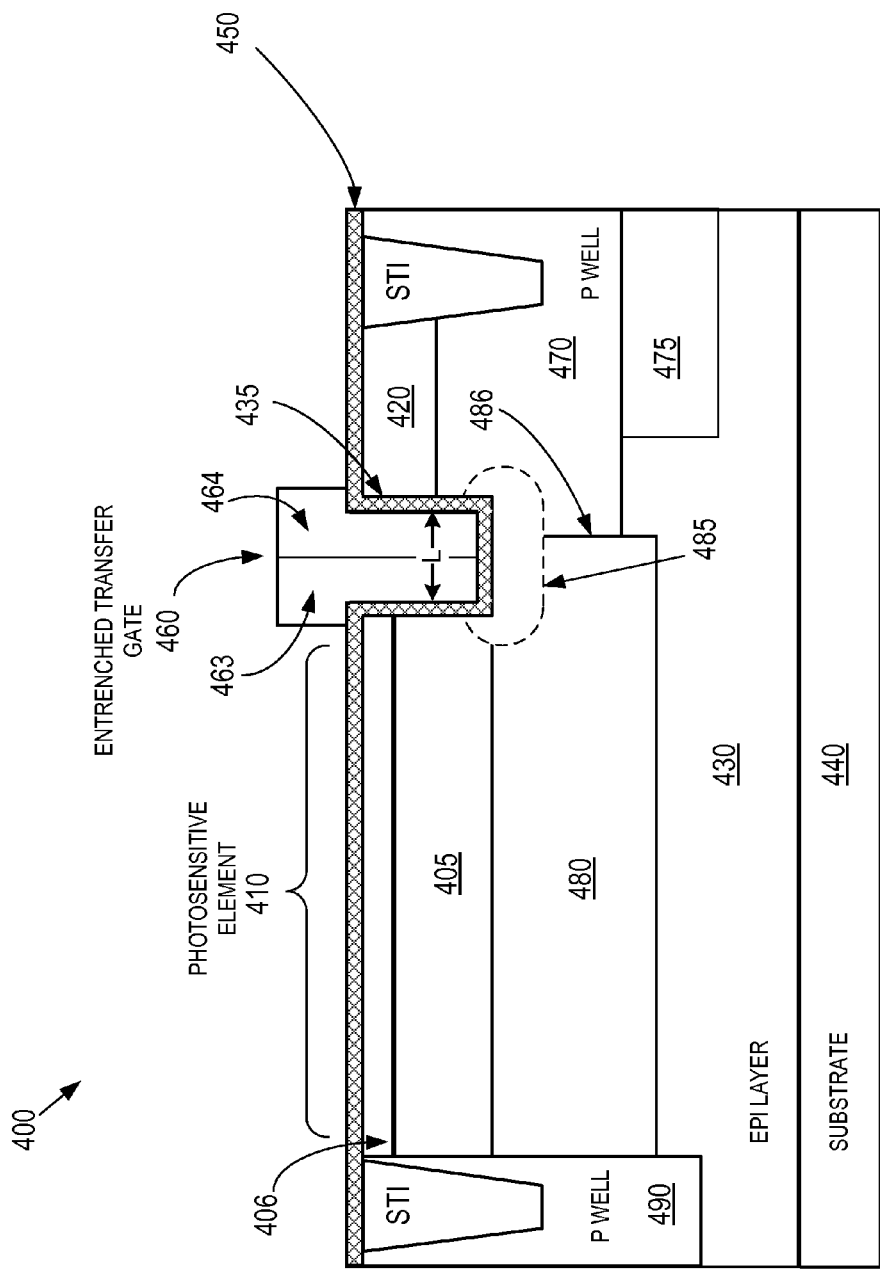
FIG. 4 is a cross-sectional view of a pixel cell including a P+/N+ dual element entrenched transfer gate with self-aligned punch-through stopper, in accordance with an embodiment.

FIG. 4 is a cross-sectional view of a pixel cell 400 illustrating a p+/n+ dual element entrenched transfer gate with a self-aligned PTS, according to an embodiment. For simplicity, only certain elements of pixel cell 400 are shown in FIG. 4, such as a photosensitive element 410, p+/n+ dual element entrenched transfer gate 460, and a floating node 420, while other elements have been excluded. Photosensitive element 410 includes an n-type photosensitive region 405 and a p-type pinning region 406. Photosensitive element 410 is formed in epi layer 430 which is disposed over substrate 440. STI regions electrically isolate adjacent pixel cells and are formed within p-wells 470 and 490. A trench 435 is formed on the frontside of epi layer 430, between the n-type photosensitive region 405 and the floating node 420. In the illustrated embodiment, a gate oxide layer 450 lines the top surface of epi layer 430, and covers the upper surface of STI, p-type pinning region 406, floating node 420, p-wells 470 and 490, and the inner surface of trench 435. Entrenched transfer gate 460 substantially fills the void created by trench 435 and is formed on top of the part of the gate oxide layer 450 that lines the inner surface of trench 435. The part of the gate oxide layer 450 that lines the inner surface of trench 435 separates entrenched transfer gate 460 from n-type photosensitive region 405, deep n-type region 480, p-well 470, and floating node 420. Entrenched transfer gate 460 substantially fills trench 435 and includes a bottom portion that substantially fills in gate oxide-lined trench 435 and a top portion that is on top of the bottom portion.

In the illustrated embodiment, entrenched transfer gate 460 is split into two portions, a p type portion 463 and n type portion 464. In one embodiment, portions 463 and 464 are doped polysilicon. In the illustrated embodiment, these portions split entrenched transfer gate 460 along a substantially vertical separation line (e.g., a line that is substantially normal to the top surface of epi layer 430) such that p type portion 463 is adjacent to photosensitive region 405 and n type portion 464 is adjacent to floating node 420. The p+/n+ dual element composition of the entrenched transfer gate 460 produces a potential gradient that encourages movement of charge back and forth between n-type photosensitive region 405 and floating node 420 more efficiently. The difference in work functions of the p type element 463 and n type element 464 may be as much as 1V depending on the concentration of ions in these elements. Such a difference may reduce the occurrence of image lag as well as dark current in an image sensor. Ion concentrations of the p type element 463 and the n type element 464 may be varied to achieve desirable work functions. For example, the ion concentrations of the p+/n+ dual element transfer gate may range between $10^{19}$ and $10^{22}/\text{cm}^3$ separately for each of the portions 463 and 464.

In other embodiments, portion 464 of entrenched transfer gate 460 may be intrinsic or undoped. In these embodiments, there is a graded potential gradient below the transfer gate, however, with ever decreasing gate lengths, it may be easier to implant one portion 463 of entrenched transfer gate 460, with p+ dopant, and leave the other portion 464, undoped. In yet other embodiments, portion 464 of entrench transfer gate 460 may be lightly p type doped (or p−) or lightly n type doped (or n−). The potential gradient under the transfer gate may be higher than the graded potential gradient if portion 464 of entrenched transfer gate 460 is undoped. These embodiments are well suited for image sensors with transfer gate lengths of less than 0.3 µm though longer lengths may also be implemented.

Figure 5A:
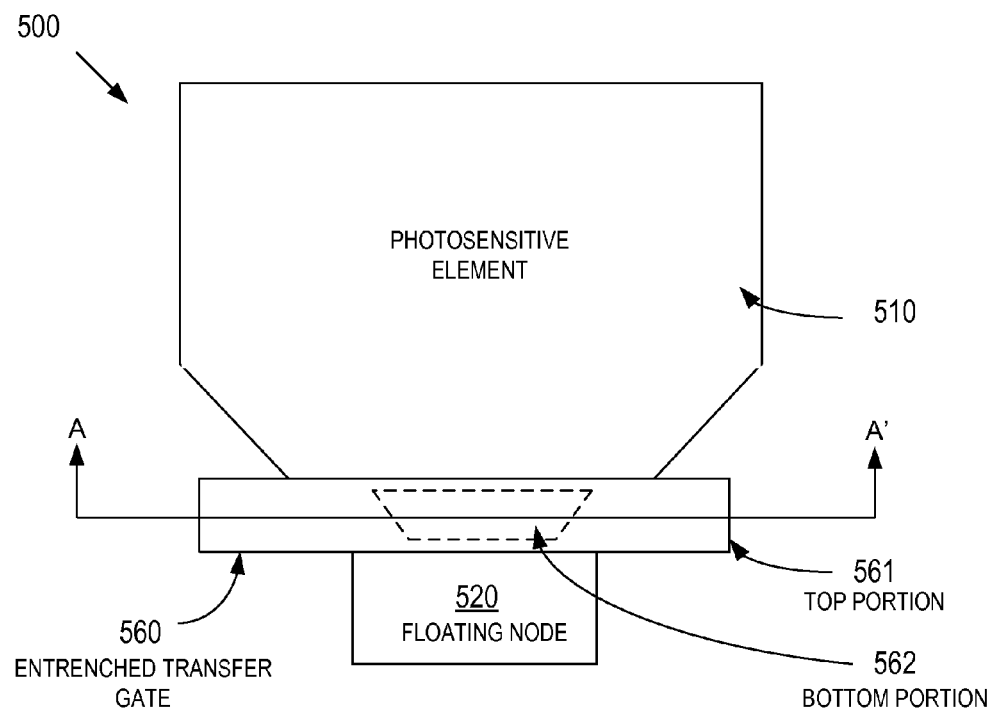
FIG. 5A is a planar view of a pixel cell illustrating a photosensitive region, a transfer transistor, and a reset transistor with an entrenched transfer gate, in accordance with an embodiment.

FIG. 5A is a planar view of pixel cell 500, according to an embodiment. For simplicity, only certain elements of pixel cell 500 are illustrated in FIG. 5A, such as photosensitive element 510, transfer gate 560, and floating node 520. The entrenched transfer gate 560 includes top portion 561 (shown in solid lines) and bottom portion 562 (shown in dashed lines). Top portion 561 is situated above the bottom portion 562. Bottom portion 562 fills in a trench (not shown in FIG. 5A) that is situated between the photosensitive element 510 and the floating node 520. FIG. 5A shows that bottom portion 562 generally conforms to the dimensions of photosensitive element 510 and floating node 520. For example, the bottom portion 562 may be trapezoidal in shape, with the trapezoidal further having a short side that is adjacent to floating node 520 and a long side that is adjacent to the photosensitive element 510.

Figure 5B:
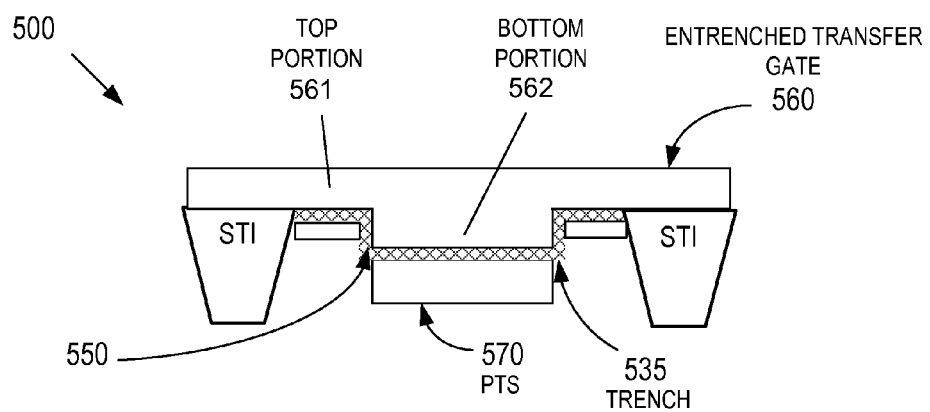
FIG. 5B is a cross-sectional view of the pixel cell of FIG. 5A, taken substantially along section line A-A' in FIG. 5A.

FIG. 5B is a cross-sectional view of pixel cell 500 of FIG. 5A, taken substantially along section line A-A' in FIG. 5A. Here, entrenched transfer gate 560 is shown to include top portion 561 and bottom portion 562 with top portion 561 situated above bottom portion 562. Bottom portion 562 fills a trench 535 that is lined with a layer of gate oxide 550. P-type self-aligned PTS 570 is formed in the region that is under bottom portion 562. A pixel cell with an entrenched transfer gate similar to that of transfer gate 560 as shown in FIGS. 5A and 5B may have low levels of noise due to dark current.

Figure 6A:
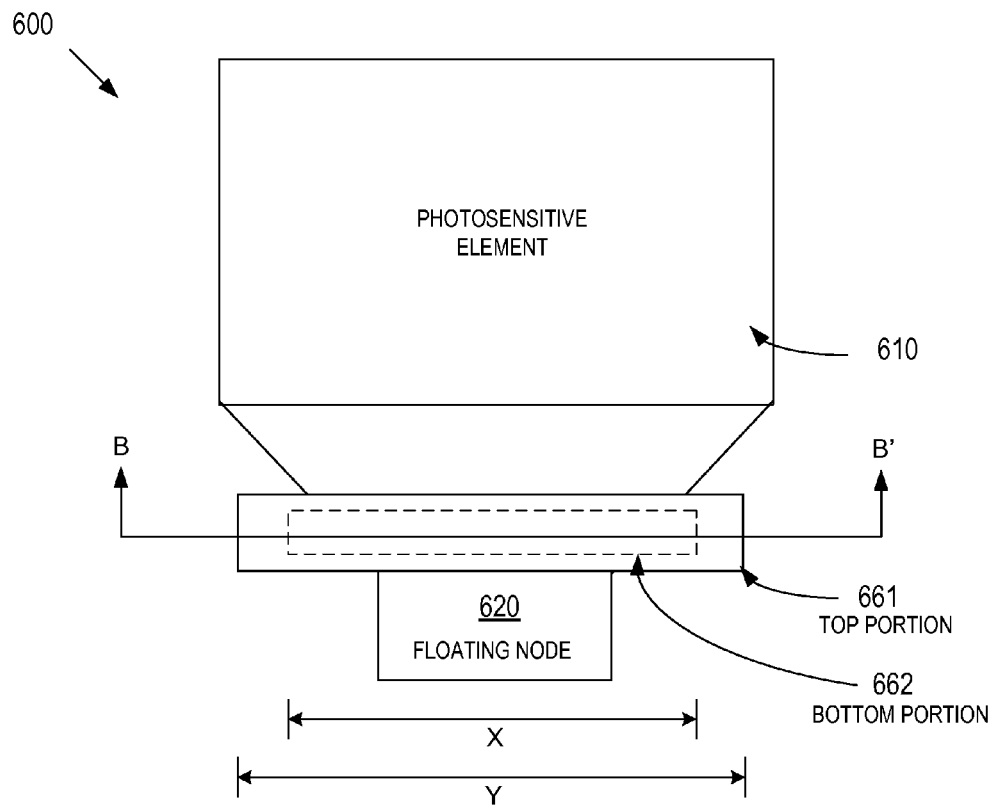
FIG. 6A is a planar view of a pixel cell illustrating a photosensitive region, a transfer transistor, and a reset transistor with an entrenched transfer gate, in accordance with an embodiment.
Figure 6B:
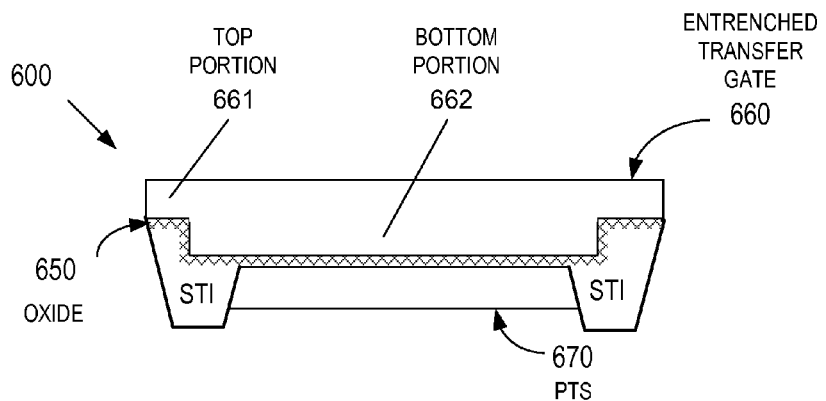
FIG. 6B is a cross-sectional view of the pixel cell of FIG. 6A, taken substantially along section line B-B' in FIG. 6A.

FIG. 6A is a planar view of a pixel cell 600 according to another embodiment of the invention. For simplicity, only certain elements of pixel cell 600 are illustrated in FIG. 6A, such as photosensitive element 610, entrenched transfer gate 660 and floating node 620. FIG. 6B is a cross-sectional view of pixel cell 600, taken substantially along section line B-B' in FIG. 6A.

Entrenched transfer gate 660 includes top portion 661 and bottom portion 662. Bottom portion 662 fills in gate oxide 650 lined trench 635. From the planar view, it can be seen that bottom portion 662 is rectangular in shape and its dimension X that is transverse to the transfer transistor channel is smaller than the corresponding dimension Y of top portion 661. P-type self-aligned PTS 670 is formed in the region under bottom portion 662. Pixel cell 600 with entrenched transfer gate 660 may experience fewer occurrences of image lag, higher sensitivity, and greater full well capacity.

In some embodiments, the entrenched transfer gate may extend as deep as the STI. In other embodiments, the entrenched transfer gate may be shallower than the STI. In one embodiment, the entrenched transfer gate extends between 0.05 µm and 0.35 µm into the epi layer. In one embodiment, the length L of trench 335 is less than 0.3 µm.

It should be noted that the above description assumes implementation of image sensors using red, green and blue photosensitive elements. Those skilled in the art having benefit of the instant disclosure will appreciate that the description is also applicable to other primary or complementary color filters.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor pixel, comprising:
   a semiconductor layer;
   a photosensitive region having a second polarity disposed within the semiconductor layer to accumulate photo-generated charge;
   a floating node disposed within the semiconductor layer;
   a trench extending into the semiconductor layer between the photosensitive region and the floating node;
   an entrenched transfer gate disposed within the trench to control transfer of the photo-generated charge from the photosensitive region to the floating node;
   a well of a first polarity disposed within the semiconductor layer adjacent to the trench, wherein the floating node has the second polarity opposite the first polarity and is at least partially disposed within the well;
   a deep doped region of the second polarity disposed within the semiconductor layer below the photosensitive region and adjacent to the photosensitive region,
   wherein the well of the first polarity and the deep doped region of the second polarity interface forming a P-N junction, the well does not extend under the photosensitive region; and
   a punch-through stopper region of the first polarity disposed below the trench and extending entirely along the bottom of the trench and wrapping around both sides of the bottom of the trench such that the punch-through stopper region interfaces with the photosensitive region, the deep doped region, and the well.

2. The image sensor pixel of claim 1, wherein the entrenched transfer gate comprises:
   a bottom portion disposed within the trench that extends into the semiconductor layer; and
   a top portion disposed over the bottom portion that extends above a top surface of the semiconductor layer.

3. The image sensor pixel of claim 2, wherein the bottom portion is substantially trapezoidal with a long side facing the photosensitive region and a short side facing the floating node.

4. The image sensor pixel of claim 2, wherein a first dimension of the bottom portion that is transverse to a transistor channel below the entrenched transfer gate is shorter than a second dimension of the top portion that is also transverse to the transistor channel.

5. The image sensor pixel of claim 1, further comprising:
   a gate oxide layer lining the trench and separating the entrenched transfer gate from the photosensitive region and the floating node.

6. The image sensor pixel of claim 1, wherein the punch-through stopper region comprises a self-aligned region.

7. The image sensor pixel of claim 1, further comprising:
   a deep well of the first polarity, wherein the deep well is disposed below the well and extends deeper into the semiconductor layer than the deep doped region.

8. The image sensor of claim 1, wherein the entrenched transfer gate comprises:

a first portion; and
a second portion,
wherein the first portion and the second portion have a doping difference and create a potential gradient within the entrenched transfer gate,
wherein the first portion is adjacent to the photosensitive region and the second portion is adjacent to the floating node.

9. The image sensor of claim 8, wherein the first portion and the second portion split the entrenched transfer gate along a line that extends substantially normal to a top surface of the semiconductor layer.

10. The image sensor of claim 8, wherein the polarity of the first portion is opposite of the polarity of the photosensitive region and wherein the polarity of the second portion and the polarity of the floating node is the same.

11. The image sensor of claim 8, wherein the second portion of the entrenched transfer gate is undoped.

12. The image sensor of claim 8, wherein the second portion has a lower dopant concentration than the first portion.

13. The image sensor of claim 12, wherein the polarity of the second portion is opposite the polarity of the first portion.

14. The image sensor pixel of claim 1, wherein the deep doped region extends entirely under the entrenched transfer gate and further extends under the floating node such that the P-N junction is positioned under the floating node, and where the punch-through stopper region extends under the floating node and is at least partially disposed between the floating node and the P-N junction.

15. The image sensor pixel of claim 1, wherein the punch-through stopper region extends entirely along a second side of the entrenched transfer gate adjacent to the photosensitive region such that the punch-through stopper region is at least partially disposed between the entrenched transfer gate and the photosensitive region.

16. An image sensor pixel, comprising:
a semiconductor layer;
a photosensitive region disposed within the semiconductor layer to accumulate photo-generated charge;
a floating node disposed within the semiconductor layer;
a trench extending into the semiconductor layer between the photosensitive region and the floating node;
an entrenched transfer gate disposed within the trench to control transfer of the photo-generated charge from the photosensitive region to the floating node;
a well of a first polarity disposed within the semiconductor layer adjacent to the trench, wherein the floating node has a second polarity opposite the first polarity and is at least partially disposed within the well;
a deep doped region of the second polarity disposed within the semiconductor layer below the photosensitive region and adjacent to the photosensitive region; and
a punch-through stopper region of the first polarity disposed below the trench, wherein the deep doped region extends at least partially beneath the punch-through stopper region, wherein the punch-through stopper region extends entirely along the bottom of the trench and wraps around both sides of the bottom of the trench such that the punch-through stopper region interfaces with the photosensitive region, the deep doped region, and the well,
wherein the well of the first polarity and the deep doped region of the second polarity interface form a P-N junction, and the well does not extend under the photosensitive region, and the deep doped region extends more than half a width of the entrenched transfer gate under the entrenched transfer gate such that the P-N junction is positioned closer to a first side of the entrenched transfer gate adjacent to the floating node than to a second side of the entrenched transfer gate adjacent to the photosensitive region.

17. The image sensor pixel of claim 16, wherein the deep doped region extends entirely under the entrenched transfer gate and further extends under the floating node such that the P-N junction is positioned under the floating node, and wherein the punch-through stopper region extends under the floating node and is at least partially disposed between the floating node and the P-N junction.

18. The image sensor pixel of claim 16, wherein the punch-through stopper region extends entirely along the second side of the entrenched transfer gate such that the punch-through stopper region is at least partially disposed between the entrenched transfer gate and the photosensitive region.

* * * * *